LIGHT-EMITTING PHOSPHOR-DIODE COMBINATION

Filed March 28, 1968

Inventors:
Simeon V. Galginaitis
Ralph M. Potter
by [signature]
Their Attorney 3,529,200
LIGHT-EMITTING PHOSPHOR-DIODE COMBINATION Ralph M. Potter, Pepper Pike, Ohio, and Simeon V. Galginaitis, Schenectady, N.Y., assignors to General Electric Company, a corporation of New York Filed Mar. 28, 1968, Ser. No. 716,897
Int. Cl. H01j *1/62, 63/04*
U.S. Cl. 313—108 10 Claims

ABSTRACT OF THE DISCLOSURE

A light-emitting device consisting of an infrared-emitting semiconductor p-n junction body or diode combined with a stepwise-excited phosphor which converts the infrared energy into visible light. Efficient combinations comprise gallium arsenide using silicon as an acceptor dopant, or mixed crystals of gallium-indium arsenide or of gallium arsenide-antimonide for the infrared-emitting body; and lanthanum fluoride activated by erbium or thulium and sensitized by ytterbium for the phosphor. The combination makes a solid state lamp having a bright green or blue response.

CROSS-REFERENCES TO RELATED APPLICATIONS

Figure 1:
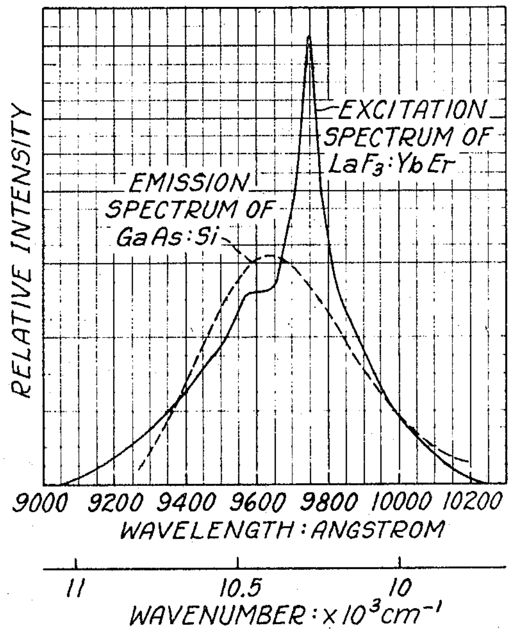

Concurrently filed copending application Ser. No. 716,898—Ralph A. Hewes and James F. Sarver, which has been abandoned in favor of continuation-in-part patent application Ser. No. 767,038, filed Sept. 18, 1968, discloses and claims an antistokes phosphor consisting of fluorides of lanthanum, gadolinium or yttrium activated by erbium or thulium and sensitized by ytterbium.

Concurrently filed copending application Ser. No. 716,921—Ralph A. Hewes discloses and claims an antistokes phosphor consisting of oxysulfides of lanthanum, gadolinium or yttrium activated by erbium or thulium and sensitized by ytterbium.

BACKGROUND OF THE INVENTION

This invention relates to the direct conversion of electrical energy into light. One device which does this is known as a light-emitting diode. It comprises a wide band-gap semiconductor material in which a p-n junction is formed by suitable doping with impurity atoms. Upon application of a forward bias across the junction, electrons flow from the n-side into the p-side, and holes flow from the p-side into the n-side. As electrons and holes recombine, visible light is produced if the band gap is sufficiently large, about two electron volts or better.

The majority of semiconductors, including germanium and silicon, have small band gaps so that their emission is in the infrared. There are relatively few wide band-gap materials which can be made p- and n-type to make efficient light-emitting diodes or bodies. Among the useful materials are gallium phosphide which is used for red-emitting diodes, and silicon carbide which makes yellow-emitting diodes. There is no semiconductor material available from which devices have been made having comparable brightness in green or blue. There is a green-emitting gallium phosphide, but its efficiency is less than 10% that of the red-emitting gallium phosphide.

SUMMARY OF THE INVENTION

The object of the invention is to provide a semiconductor device or solid state lamp of relatively high brightness and efficiency and preferably emitting in the green or blue.

The light emitted by a phosphor is usually less energetic and therefore at a longer wavelength than the exciting radiation. This fact was early recognized and became known as Stokes' law and the reason for it can be appreciated from a consideration of electron energy levels. After photo excitation of an atom by light of a certain wavelength wherein an electron is raised to a given energy level, some nonradiative energy decay will occur due to lattice rearrangement before a light-emitting transition back to the ground state occurs. Thus the light emission arises out of a smaller energy transition and hence is of longer wavelength. However quite a few phosphors, sometimes referred to as antistokes phosphors, are now known which do not obey Stokes' law. These include phosphors wherein the light emission mechanism involves a stepwise or multi-stage excitation of the atom. For instance, in a two-stage excitation, a first quantum of radiation lifts an electron up to one level, and then another quatum lifts the same electron to a higher energy level. A transition of the electron from the higher energy level back to the ground state will cause the emission of a radiation quantum more energetic than either input quantum. Hence the emitted radiation from the phosphor has a shorter wavelength than the exciting radiation. Examples of such phosphors are ZnCd:AgCu described by one of us (R. M. Potter) at J. Electrochem Soc., 106, 58C (1959) producing green light with orange and infrared excitation at room temperature; and $LaCl_3:Pr^{3+}$ described by J. F. Porter, Jr., Phys. Rev. Letters, 7, 414 (1961).

The main stimulant behind development of stepwise excited phosphors has been the possibility of using them to improve the efficiency of incandescent lamps by converting their over-abundant emission of infrared radiation into visible light. Up to the present time this scheme has not been commercially successful because the known stepwise-excited phosphors absorb more visible radiation from the incandescent filament than they produce by conversion of infrared.

In accordance with our invention, we have now found that practical light-emitting devices can be made by combining an infrared-emitting semiconductor p-n junction body with a stepwise infrared-excited visible-emitting phosphor. The value of the combination arises from the fortunate matching of characteristics and requirements of a certain group of high efficiency stepwise-excited phosphors with those of infrared-emitting p-n junction bodies or diodes.

The phosphors are characterized as follows: (1) The dependence of visible light output on incident infrared intensity is superlinear. The output of a two-step-excited phosphor, for instance, increases about as the square of incident infrared intensity, and the conversion efficiency increases almost linearly with incident intensity. This places a tremendous premium on exciting the phosphor at the highest possible infrared intensities. (2) The efficiency of the phosphors falls off when their temperature is raised much above room temperature. (3) The excitation spectrum of the phosphors is a narrow one, less than 1000 $cm.^{-1}$ (wave-numbers) at the half-width.

The foregoing characteristics describe generally the class of rare-earth-activated phosphors and particularly those sensitized with ytterbium.

The foregoing characteristics do not make these phosphors well suited to the application of converting the infrared radiant energy wasted in incandescent lamps. (1) The tungsten filament, roughly equivalent to a black body at 2500° C., is actually a relatively low intensity source of infrared and optical coupling to a phosphor such as described results in very low efficiency. (2) The infrared from an incandescent source is present in a very wide spectrum—about 10,000 $cm.^{-1}$ (wave-numbers) half-width from 2500° C. black body emission. Since the excitation spectrum of the phosphor is less than 1000 $cm.^{-1}$ (wave-numbers) wide, most of the energy is wasted. (3) To prevent heating up of the phosphor by the heat transmitted by radiation, convection or conduction from the filament, the phosphor would have to be placed physically remote from the filament, as on the envelope wall. This entails a substantial reduction, tenfold or better, on the incident intensity upon the phosphor.

In the combination of our invention on the other hand, the described phosphor characteristics are uniquely matched to the characteristics of typical infrared-emitting semiconductor p-n junction devices. (1) Such devices are capable of very high surface intensity of infrared, approaching that of a 6000° C. black body radiator. (2) High intensities of infrared output can be obtained from these devices without appreciable heating up and they constitute truly "cold light" sources. (3) The emission spectrum of these devices is relatively narrow, less than 1000 $cm.^{-1}$ at the half-width. (4) The average power input is limited by rise in temperature of the diode, which results in a decrease in efficiency of infrared production. However these diodes can be turned off and on rapidly, in microseconds or less. This permits pulsing on a low duty cycle to increase the instantaneous output intensity at least one order of magnitude above that which can be maintained under direct current, but with the same average power input.

It is evident from the foregoing that highly effective combinations will be achieved when the excitation spectrum of a particular phosphor matches the emission spectrum of a given infrared-emitting p-n junction device, that is when there is coincidence or near-coincidence of excitation and emission spectra.

Suitable combinations may use for the phosphor a fluoride of lanthanum, gadolinium or yttrium activated by erbium or thulium and sensitized by ytterbium. These phosphors have an excitation spectrum extending from approximately 9000 to 10,400 A.

Other phosphors suitable for the combination are oxysulfides of lanthanum, gadolinium or yttrium activated by erbium or thulium and sensitized by ytterbium.

For the infrared-emitting device, a gallium arsenide diode containing a p-n junction and in which the region of p-type conductivity is formed by using silicon as the acceptor dopant is suitable, and provides an emission within the excitation spectrum of the phosphor. An advantage of using silicon as the acceptor dopant as compared to other possible acceptor impurities is that the peak of the spectral emission from the resulting p-n junction is more nearly "in tune" with the phosphor, that is the emission peak of the diode and the excitation peak of the phosphor are more nearly coincident. For the n-type region, the choice of dopant is not critical but silicon may also be used by reason of its amphoteric nature and is convenient.

It is also possible to "tune" the p-n junction or diode to the phosphor by using a mixed crystal for the body in which the junction is formed. Examples are mixed crystals of gallium-indium arsenide (Ga, In)As and gallium arsenide-antimonide Ga(As, Sb). In mixed crystals the peak of the emission spectrum may be shifted within limits by varying the proportions of the two constituents, that is the ratio of gallium to indium or the ratio of arsenic to antimony. Regions of opposing conductivity to form a p-n junction may be achieved, for example, by growing a crystal which exhibits n-type conductivity due to the addition of tellurium as an impurity. A region of p-type conductivity can then be obtained by diffusion of zinc into the material. Alternatively silicon may also be used as p-type dopant.

The phosphor can be optically coupled to the source of radiation in a number of ways. In one convenient arrangement, the phosphor is suspended in a suitable binder and painted over the infrared-emitting surface of the diode. An alternative arrangement which is optically advantageous is to grow the phosphor as a single crystal and put it in intimate optical contact with the diode crystal. In such an arrangement, both crystals may be ground and polished on one face and cemented together with transparent cement.

DESCRIPTION OF PREFERRED EMBODIMENTS

In FIG. 1 the solid line curve shows a typical excitation spectrum of lanthanum fluoride sensitized with ytterbium and activated by erbium; this specific curve represents the spectrum of $L_{0.87}F_3Yb_{0.12}Er_{0.01}$. The intensity of the Er luminescence depends upon both the amount of Yb present and upon the intensity of incident radiation lying within the Yb absorption band. In the range of incident intensity measured, the luminescence varies about as the square of the incident radiation and this indicates that two infrared quanta are required to produce one visible light quantum. The excitation spectrum extends from about 9100 A. ($11.0\times10^{+3}$ $cm.^{-1}$) to 10,200 A. ($9.8\times10^{+3}$ $cm.^{-1}$) and the band width at half intensity is about 500 $cm.^{-1}$. The dash-line curve represents the emission spectrum of gallium arsenide using silicon as an amphoteric dopant to produce a p-n junction. The band width of the emission spectrum at half intensity is also about 500 $cm.^{-1}$. In the phosphor excitation curve and the diode emission curve there is a reasonably close match or coincidence of the peaks so that an effective combination results.

Figure 2A:
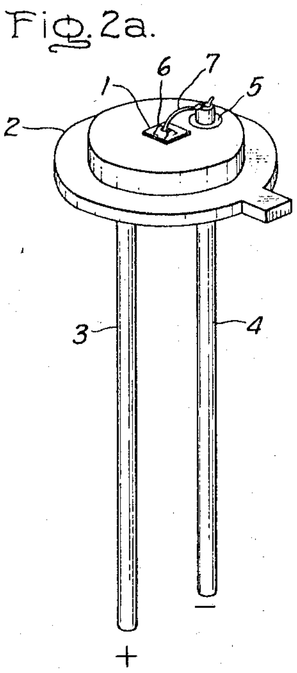
Figure 2B:
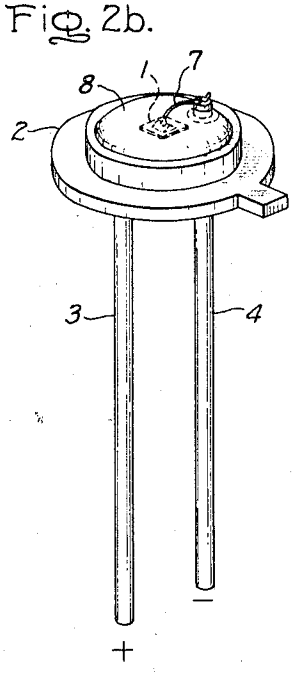
Figure 2C:
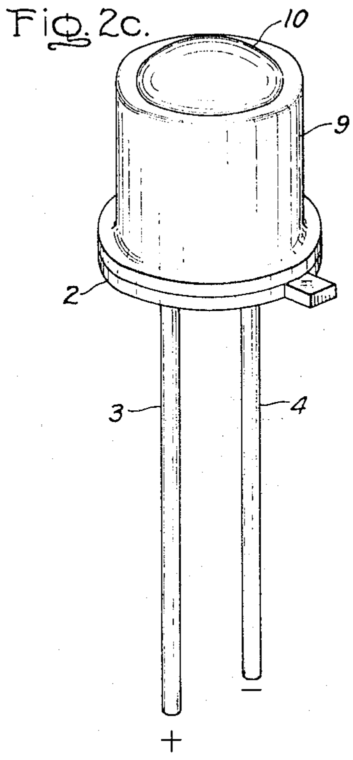

A light-emitting diode or solid state lamp embodying the invention is illustrated at successive stages of completion in FIGS. 2*a* to *c*. A crystal chip of gallium arsenide suitably doped to form a junction and using silicon as the acceptor impurity is shown at 1 mounted on a transsistor type header 2. The header comprises a gold-plated base disc to whose underside is attached a ground leadwire 3. Another lead-wire 4 projects through the disc but is insulated therefrom by a sleeve 5. The gallium arsenide chip is conductively attached p-side down to the header disc, suitably by alloying or soldering using indium-zinc (preferred), lead-indium-zinc, siver-indium-zinc or gold-zinc as bonding alloys whereby ohmic contact can be made. Ohmic contact is made to the n-side by fusing tin (preferred), gold-germanium or silver-indium-germanium solder in the form of a small dot 6 to the n-type side previous to mounting on the header. After the chip is mounted on the header, a soft metal wire 7, suitably gold, is thermocompression-bonded to the alloyed dot 6 on the top side thereof, bent over laterally, and thermocompression bonded to the top of lead wire 4 projecting through the disc as shown in FIG. 2*a*.

The lanthanum fluoride phosphor may be optically coupled to the infrared-emitting crystal 1 by suspending it in a suitable binder such as a polymer. Polystyrene has been found suitable. A drop of the phosphor suspended in polystyrene dissolved in a thinner such as acetone is placed on the header and allowed to dry. The phosphor-in-polystyrene sets as a blob 8 on top of the header as shown in FIG. 2*b*, and covers the crystal chip to a thickness of a few thousandths of an inch. Being an insulator, the phosphor-in-polystyrene does not affect the electrical characteristics of the device. The header may be capped by a metal can or cover 9 equipped with a lens 10 in its end wall as shown in FIG. 2*c*, whereby to enclose and protect the diode and phosphor. Alternatively an all glass cap may be used which is most conveniently cemented to the base disc.

Upon application of 1.5 volts D.C. to the diode with the polarity indicated, the input current was 100 milliamperes and the device lit up green with a brightness of 70 to 100 footlamberts about the center of the phosphor plastic blob overlying the crystal chip. This brightness is easily visible in the usual ambient indoor illumination.

For a blue-emitting solid state lamp we prefer to use lanthanum fluoride activated with thulium and sensitized with ytterbium. A specific formulation found suitable is $La_{0.7985}F_3Yb_{0.20}Tm_{0.0015}$. In other respects the solid state lamp may be constructed in the same way as previously described herein.

What we claim as new and desire to secure by Letters Patent of the United States is:

1. A light-emitting device comprising in infrared-emitting semiconductor for p-n junction body which emits radiation over a narrow spectral range ni the infrared not wider than about 1000 $cm.^{-1}$ (wave-numbers) with an intensity greater than that of a black body at 2500° C., and a stepwise-excited phosphor which converts infrared energy into visible light and has an excitation spectrum substantially matching the emission spectrum of said body, said phosphor being optically coupled to said body in a manner to receive its infrared emission and provide a visible output.

2. A light-emitting device as defined in claim 1 wherein the phosphor is a rare-earth activated phosphor sensitized with ytterbium.

3. A light-emitting device as defined in claim 1 wherein the phosphor is a rare-earth activated phosphor sensitized with ytterbium and wherein the activator is erbium or thulium.

4. A light-emitting device as defined in claim 1 wherein the p-n junction body is gallium arsenide, gallium-indium arsenide or gallium arsenide-antimonide.

5. A light-emitting device as defined in claim 1 wherein the p-n junction body is gallium arsenide using silicon for a p-type dopant and the phosphor is a rare-earth activated phosphor sensitized with ytterbium and wherein the activator is erbium or thulium.

6. A light-emitting device as defined in claim 5 wherein the phosphor is lanthanum, gadolinium or yttrium fluoride or oxysulfide sensitized with ytterbium and activated with erbium or thulium.

7. A solid state lamp comprising a semiconductor crystal chip consisting of gallium arsenide, gallium-indium-arsenide or gallium arsenide-antimonide containing a p-n junction which emits radiation over a narrow spectral range in the infrared not wider than about 100 $cm.^{-1}$ (wave-numbers) with an intensity greater than that of a black body at 2500° C., a header whereon said crystal chip is mounted, means on said header for making ohmic contact to both sides of said crystal chip, and a stepwise-excited phosphor which converts infrared energy into visible light and has an excitation spectrum substantially matching the emission spectrum of said body, said phosphor being dispersed in a binder coated over said crystal chip.

8. A solid state lamp as defined in claim 7 wherein the phosphor is a fluoride of lanthanum, gadolinium or yttrium sensitized by ytterbium and activated by erbium or thulium.

9. A lamp as defined in claim 7 wherein the semiconductor crystal consists of gallium arsenide using silicon as a p-type dopant and the phosphor is lanthanum fluoride sensitized by ytterbium and activated by erbium or thulium.

10. A light-emitting device as defined in claim 1 wherein said phosphor is dispersed in a binder coated over said p-n junction body.

References Cited

UNITED STATES PATENTS

| | | | |
|---|---|---|---|
| 2,856,553 | 10/1958 | Henisch | 313—108 |
| 2,979,467 | 4/1961 | Keller | 252—301.45 |
| 3,265,990 | 8/1966 | Burns et al. | 331—94.5 |
| 3,339,074 | 8/1967 | Franks. | |
| 3,418,247 | 12/1968 | Yocom. | |
| 3,446,963 | 5/1969 | Kohashi et al. | 250—71 X |

OTHER REFERENCES

"Light on the Beam" Electronics Review, November 1966, pp. 45–46.

JAMES W. LAWRENCE, Primary Examiner

D. O'REILLY, Assistant Examiner

U.S. Cl. X.R.

250—217; 317—235